(12) United States Patent
Mori et al.

(10) Patent No.: US 12,138,943 B2
(45) Date of Patent: Nov. 12, 2024

(54) METHOD OF PRODUCING PRINT BOARD

(71) Applicant: Noda Screen Co., Ltd., Aichi (JP)

(72) Inventors: Yasumitsu Mori, Inuyama (JP); Akihiro Doi, Nagoya (JP)

(73) Assignee: NODA SCREEN CO., LTD., Aichi (JP)

( * ) Notice: Subject to any disclaimer, the term of this patent is extended or adjusted under 35 U.S.C. 154(b) by 486 days.

(21) Appl. No.: 17/605,436

(22) PCT Filed: Nov. 25, 2020

(86) PCT No.: PCT/JP2020/043758
§ 371 (c)(1),
(2) Date: Oct. 21, 2021

(87) PCT Pub. No.: WO2021/210211
PCT Pub. Date: Oct. 21, 2021

(65) Prior Publication Data
US 2022/0134788 A1 May 5, 2022

(30) Foreign Application Priority Data
Apr. 13, 2020 (JP) ................................. 2020-071622

(51) Int. Cl.
B41M 1/12 (2006.01)
B32B 3/26 (2006.01)
(Continued)

(52) U.S. Cl.
CPC .............. B41M 1/12 (2013.01); B32B 3/266 (2013.01); B32B 3/30 (2013.01); B32B 7/12 (2013.01);
(Continued)

(58) Field of Classification Search
CPC ......... B41M 1/12; B41M 3/006; B32B 3/266; B32B 3/30; B32B 7/12; B32B 2457/08;
(Continued)

(56) References Cited

U.S. PATENT DOCUMENTS

| 6,792,852 B2 | 9/2004 | Kawakita |
| 2003/0131741 A1 | 7/2003 | Kawakita |

(Continued)

FOREIGN PATENT DOCUMENTS

| JP | 57-166095 | 10/1982 |
| JP | H11-220256 | 8/1999 |

(Continued)

OTHER PUBLICATIONS

Partial Supplementary European Search Report issued Apr. 3, 2023 in European Patent Application No. 20930664.6.
Extended European search report issued Aug. 31, 2023 in European Patent Application No. 20930664.6.

*Primary Examiner* — Patricia D Valenzuela
(74) *Attorney, Agent, or Firm* — Wenderoth, Lind & Ponack, L.L.P

(57) ABSTRACT

Even if a print board includes through holes that are hardly filled with material previously, the through holes can be filled with filling material appropriately. The sealing film is attached to a lower surface of the print board and the filling material is supplied from the upper surface side of the print board under a vacuum atmosphere with screen printing to fill the through holes with the filling material. Then, the film is separated from the print board and the print board is disposed on the jig plate including recesses such that the through holes correspond to the recess. Thereafter, an auxiliary filling process in which the filling material is supplied again such that the filling material protrudes from the lower surface side of the through hole is performed.

10 Claims, 15 Drawing Sheets

(51) Int. Cl.
  *B32B 3/30*  (2006.01)
  *B32B 7/12*  (2006.01)
  *B41M 3/00*  (2006.01)
  *H01B 1/02*  (2006.01)
  *H01B 1/12*  (2006.01)

(52) U.S. Cl.
  CPC ......... *B41M 3/006* (2013.01); *B32B 2457/08* (2013.01); *H01B 1/02* (2013.01); *H01B 1/12* (2013.01)

(58) Field of Classification Search
  CPC .............. C09J 2203/326; C09J 2301/18; C09J 2301/204; C09J 7/20; H05K 3/0094; H05K 3/42; H05K 2201/0959; H05K 2203/0139; H05K 2203/025; H05K 2203/1476; H05K 3/421; H05K 3/1216; H05K 3/281; H05K 2201/09572; H01B 1/02; H01B 1/12
  See application file for complete search history.

(56) References Cited

U.S. PATENT DOCUMENTS

| | | |
|---|---|---|
| 2013/0097857 A1 | 4/2013 | Himori et al. |
| 2013/0146817 A1 | 6/2013 | Himori et al. |
| 2013/0299752 A1 | 11/2013 | Himori et al. |

FOREIGN PATENT DOCUMENTS

| | | |
|---|---|---|
| JP | H11-317578 | 11/1999 |
| JP | 2000-133934 | 5/2000 |
| JP | 2002-158441 | 5/2002 |
| JP | 2002-164649 | 6/2002 |
| JP | 2003-188308 | 7/2003 |
| JP | 2003-205594 | 7/2003 |
| JP | 2003-309371 | 10/2003 |
| JP | 2005-057109 | 3/2005 |
| JP | 2005-268828 | 9/2005 |
| JP | 2008-84993 | 4/2008 |
| JP | 2009-081305 | 4/2009 |
| JP | 2012-82260 | 4/2012 |
| WO | 00/30419 | 5/2000 |
| WO | 2012/147314 | 11/2012 |

METHOD OF PRODUCING PRINT BOARD

TECHNICAL FIELD

The present technology relates to a method of producing a print board including through holes that is to be filled with resin.

BACKGROUND ART

A build-up printed circuit board has been used as a high-density interconnector printed circuit board for an electronic device. The build-up printed circuit board includes a core board including through holes and circuit layers that are disposed on top of each other on two surfaces of the core board via insulating layers. The through holes of the core board are filled with resin used for filling holes and the two surfaces of the core board are subjected to buffing and flattened. The circuit layers are disposed on the flattened surfaces. The layers are disposed on top of each other sequentially on the core board as described above to obtain a multi-layered board. Therefore, low flatness of the core board may adversely affect flatness of the layers disposed on the core board and precision of the circuit pattern. The flatness is highly required for the core board and such requirement is not limited to the core board of such a type of build-up printed circuit board and also required for a print board of an IC package including a semiconductor chip because low flatness may lower connection reliability between the print board and the semiconductor chip.

Examples of a method of producing such a print board that includes through holes and requires high flatness are described in Patent Document 1 and Patent Document 2. In such methods, an adhesive film is attached to a lower surface of the print board such that the through holes have a bottomed structure and filling material is disposed on the print board and pushed into the through holes by sliding a squeegee thereon under a vacuum atmosphere. Then, after the filling material is cured, the adhesive film is removed from the lower surface and remaining resin on the two surfaces of the print board is removed with buffing to flatten the two surfaces.

RELATED ART DOCUMENT

Patent Document 1: Japanese Unexamined Patent Application Publication No. 2003-188308
Patent Document 2: Japanese Unexamined Patent Application Publication No. 2005-57109

SUMMARY OF THE INVENTION

Problem to be Solved by the Invention

In the above methods, an adhesive layer of the adhesive film firmly adheres to the filling material and when the adhesive film is separated after curing of the filling material, the adhesive layer firmly adhering to the filling material that is cured in the through holes may be removed from the adhesive film and remain in the through hole with the filling material. This lowers the properties of the print board.

If the adhesive film is separated before the curing of the filling material, a portion of the uncured filling material adheres to the adhesive film and may come out from the through hole. Accordingly, the amount of the filling material becomes insufficient on the back surface side of the print board and recessed portions having a depth of tens of micrometers may be created after the curing of the filling material. This hinders flatness of the print board.

The inventors of the present invention found the following method that is not disclosed yet. As illustrated in FIG. 1(A), a jig plate 4 that previously includes recesses 3 is arranged below a print board 1 including through holes 2 such that the jig plate 4 is contacted with the back surface of the print board 1. Then, as illustrated in FIG. 1(B), the through holes 2 are filled with filling material 7 with screen printing. A screen mask 5 and a squeegee 6 are used in screen printing. Accordingly, the through holes 2 are filled with the filling material 7 and the filling material 7 protrudes from the front and back surfaces of the print board 1 as illustrated in FIG. 1(C). The filling material 7 is cured and the two surfaces are subjected to buffing such that the cured filling material 7 that remains on the two surfaces of the print board 1 is removed and the surfaces of the print board 1 become flattened.

With respect to the print boards of the previous type, each of the through holes 2 can be similarly filled with the filling material 7 with the above-described undisclosed technology. Therefore, a print board 1 having smooth surfaces can be produced by polishing the front and back surfaces of the print board.

As to the printed circuit board including the semiconductor chip, according to the miniaturization of the semiconductor chip, intervals between the wiring patterns and through holes have become smaller in a portion of the board related to the semiconductor chip. Therefore, the printed circuit board may include an area in which micro through holes are arranged at a high density or an area including through holes having a wide variety of hole diameter size in the same board. Namely, the through holes having various hole diameters are included in the board.

When the through holes 2 are filled with the filling material 7 with the above-described screen printing, the resistance created at the time of supplying the filling material 7 into the through hole 2 is greater as the hole diameter of the through hole 2 is smaller. Therefore, if the filling is performed for the through holes 2 of various hole diameters that are included in the same board with the above undisclosed technology, the filling material is more easily pushed into the large-diameter through hole 2 than the small-diameter through hole 2. Therefore, as illustrated in FIG. 1(C), the amount of protrusion of the filling material 7 on the back surface of the print board 1 is much greater in the large-diameter through hole 2 than the small-diameter through hole 2. The protruding portions of the filling material 7 are to be removed with buffing after the filling material 7 is cured. If the board is polished to effectively remove the protruding portions of the filling material 7 in the large-diameter through holes 2, the protruding portions of the filling material 7 in the small-diameter through holes 2 may be excessively polished and a copper foil of the print board 1 may be also rubbed. A great load of polishing is necessary and this increases a consumption amount of abrasive and a great amount of expensive filling material may be wasted. In this respect, if the print conditions may be determined such that the protrusion amount of the filling material 7 from the large-diameter through hole 2 becomes appropriate with considering the polishing ability, the small-diameter through holes 2 may not be sufficiently filled with the filling material.

Problems are caused in the above configuration including the holes having various size of hole diameters. A print board that is to be disposed directly below a large semiconductor chip and includes micro through holes that are collectively arranged in a matrix may have a problem described below. The jig plate 4 that supports the print board including through holes at a high density necessarily includes a recess 3 that is large enough to cover an entire area including the through holes. With such a configuration, the peripheral portion around the through hole high-density area of the print board 1 is supported by the jig plate 4 in the screen printing and therefore, the print board 1 is less likely to be warped in the peripheral portion. However, the middle portion of the through hole high-density area in the print board 1 is warped downward by the pressing force of the squeegee 1. Such unevenness in the warping becomes greater as the thickness of the print board 1 is smaller and this eventually causes unevenness in the used amount of the filling material. Furthermore, a resistance created in the filling of the filling material 7 into a large-diameter through hole is quite small and therefore, in the print board that includes large-diameter through holes having a hole diameter of about 0.5 mm or greater, it is difficult to adjust the conditions of the screen printing to uniform the filling amount.

The present invention was made in view of the above circumstances. An object is to provide a method of producing a print board in which through holes are filled with filling material even if the print board includes through holes that are hardly filled with filling material in a previous method.

Means for Solving the Problem

The present invention relates to a method of producing a print board including through holes that are filled with filling material. The method includes a filling material filling process and an auxiliary filling process that is performed after the filling material filling process and before the filling material is cured. In the filling material filling process, openings of the through holes on one surface side of the print board are covered such that the filling material does not come out from the through holes and the filling material is pushed into the through hole from another surface side of the print board to fill the through holes with the filling material. In the auxiliary filling process, the openings of the through holes are uncovered and the filling material is supplied to the through holes again from the other surface side of the print board.

In the filling material filling process, the openings of the through holes on one surface side of the print board are covered and the filling material is pushed into the through hole to fill the through holes with the filling material. After that, before the curing of the filling material, the auxiliary filling process is performed while the openings of the through holes being uncovered. This allows the filling material to protrude from the openings of the through holes on one end side.

In the auxiliary filling process, the pressing force of pressing the filling material can be smaller than that in the filling material filling process. Therefore, if the through holes have various diameters or micro through holes are arranged at a high density or the trough holes include large-diameter through holes, the supplemental amount of the filling material does not greatly differ between the through holes. An appropriate amount of filling material is supplied to each through hole.

In the filling material filling process, a film including a base film and an adhesive layer disposed on a surface of the base film may be attached to one surface of the print board to cover the openings of the through holes such that the filling material does not come out from the through holes and the print board may be arranged on a flat jig and the filling material may be pushed into the through holes from another surface side of the print board. According to such a method, even if the print board has low flatness, the openings of the through holes can be surely covered. The film needs to be separated prior to the auxiliary filling process and a portion of the filling material in the through hole may adhere to the film and may be removed in the separation process. If so, the filling material is supplied in the auxiliary filling process and each of the through holes can be supplied with a necessary amount of filling material. If the filling material of an excessive amount that is more than the removed amount is supplied to protrude the filling material from the back surface, the protruding amounts of the through holes can be uniform.

The filling material curing process of curing the filling material is performed after the filling material of the appropriate amount is protruded uniformly from the through holes. Then, the polishing process is performed as needed to polish the protruding portions and a print board including flattened two surfaces is produced.

If the filling material filling process and the auxiliary filling process are performed with screen printing, selected ones of the through holes of the print board can be filled with filling material. Furthermore, the through holes are divided into some groups and the screen printing is performed for each of the groups of the through holes and therefore, the print conditions for the screen printing can be determined appropriately for each of the groups of the through holes to perform hole plugging.

If the film used in the film attachment process includes within the entire area an area including the adhesive layer and a non-forming area including no adhesive layer, air is likely to discharge from the through holes and the through holes can be easily filled with the filling material to the other end. Such a film is effective for a print board including small-diameter through holes having a high aspect ratio (depth/opening diameter).

If the film used in the film attachment process includes abase film including air permeable micro holes or abase film including air flowing grooves on a surface thereof, air is more likely to discharge from the through holes. Such a film is effective for a print board including through holes having a high aspect ratio.

Advantageous Effect of the Invention

According to the present invention, in the print board including through holes that are hardly filled with filling material in a previous method, the through holes can be filled with filling material appropriately.

MODES FOR CARRYING OUT THE INVENTION

First Embodiment

A first embodiment of the present invention will be described with reference to FIGS. 2 to 15.

Figure 1A:
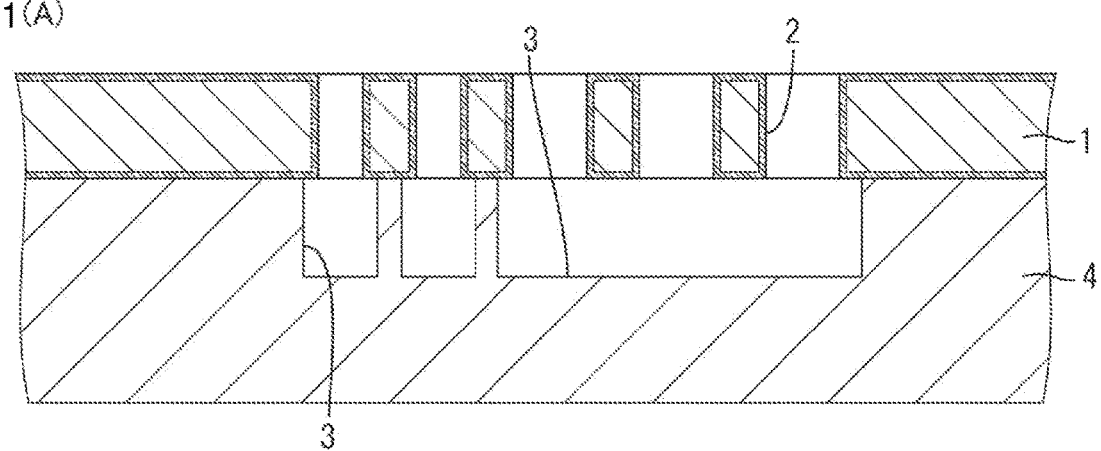
FIGS. 1 (A)-1 (C) are enlarged schematic cross-sectional views illustrating a hole plug process according to the technology that is not disclosed yet.
Figure 1B:
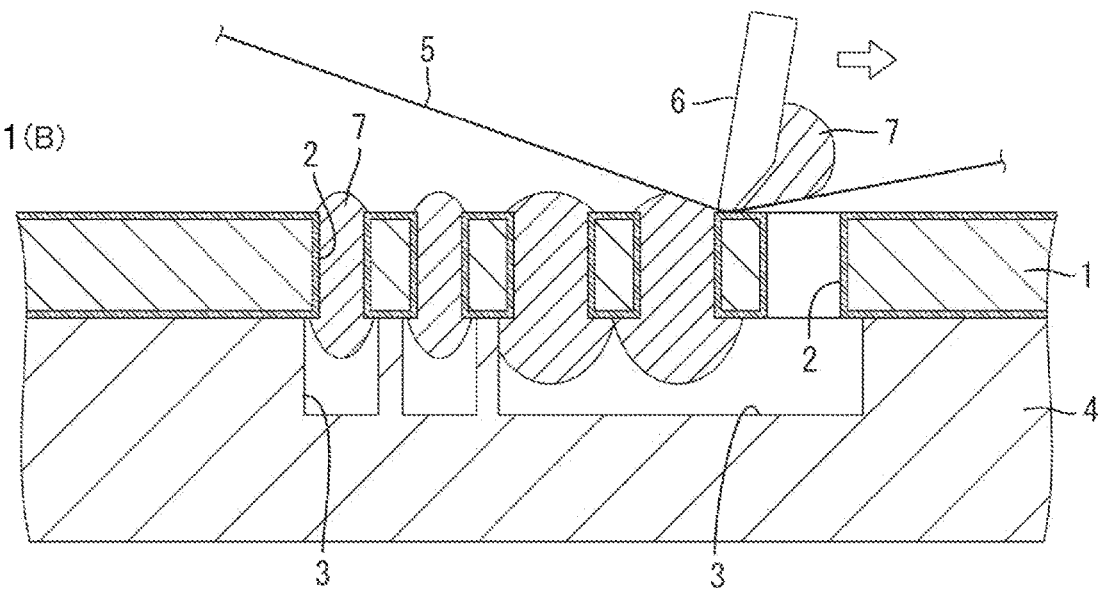
Figure 1C:
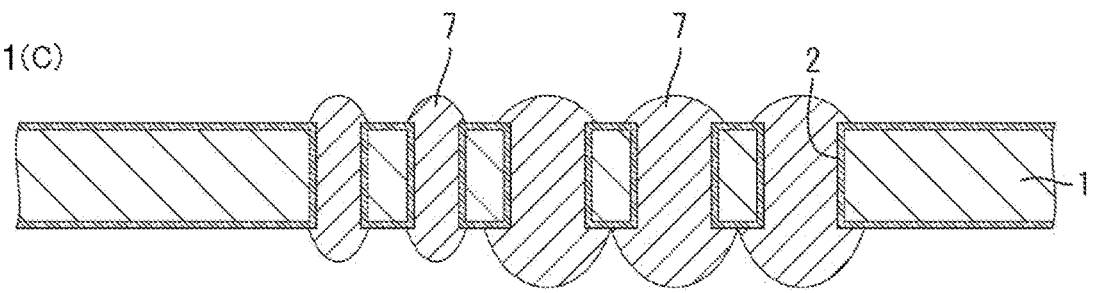
Figure 2:
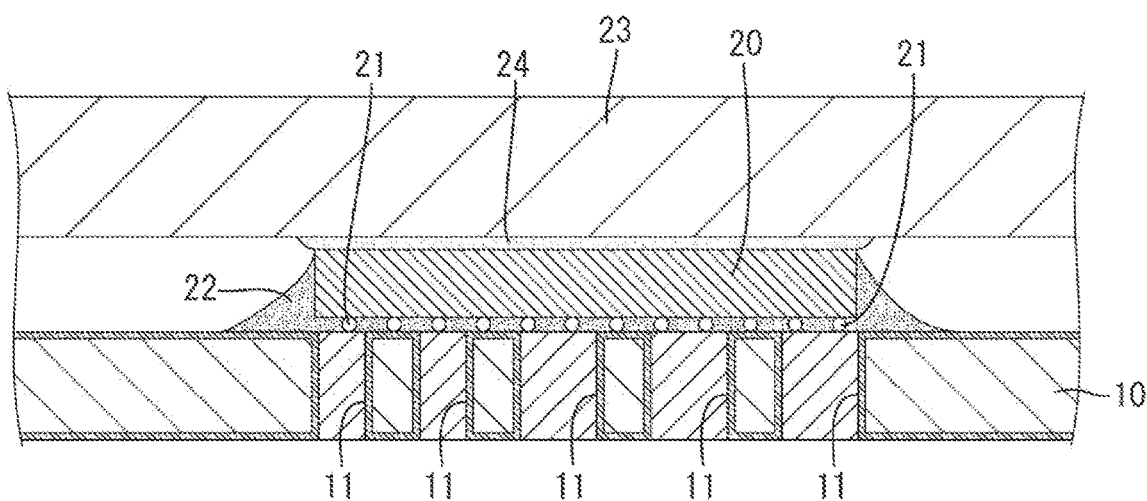
FIG. 2 is a cross-sectional view of an IC package.

In this embodiment section, the present invention is applied to a print board of an integrated circuit package including a ball grid array. A print board 10 to be produced according to this embodiment includes through holes 11. As illustrated in FIG. 2, a semiconductor chip 20 is mounted on an upper surface of the print board 10 and electrically connected to a land (not illustrated) that is disposed on an upper surface of the print board 10 via solder balls 21. The semiconductor chip 20 is fixed to the print board 10 with an adhesive 22 and a heatsink 23 is mounted on the upper surface of the semiconductor chip 20 with an adhesive 24.

Figure 3:
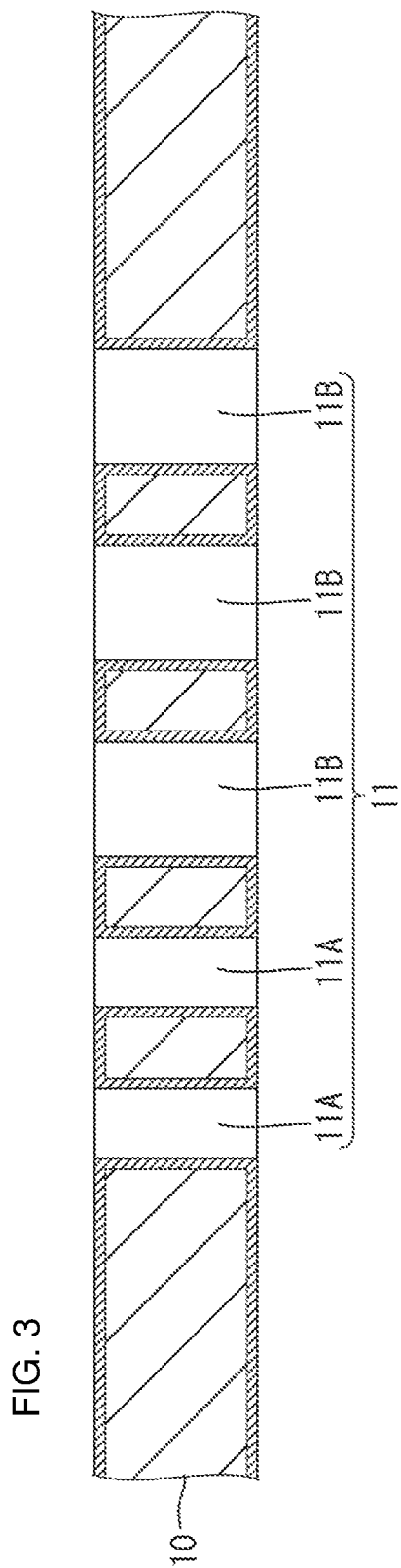
FIG. 3 is a cross-sectional view of a print board.

A print substrate having two surfaces that are covered with copper foils and a thickness dimension of about from 0.1 mm to 8.0 mm is recommended for the print board 10. The print board 10 previously includes through holes whose inner diameter is about from 0.1 mm to 5.0 mm and inner surfaces of the through holes are subjected to plating to be electrically connected to the copper foils on the two surfaces of the print board. Thus, the copper foils on the two surfaces are electrically connected to each other via the through holes 11. As illustrated in FIG. 3, the print board 10 includes openings at opening edge surfaces of the through hole 11 on the upper and lower surfaces of the print board 10, respectively. In this embodiment, the through holes 11 in the print board 10 may have various opening diameters and have different aspect ratios (the thickness of the print board 10/the opening diameter of the through hole 11). For example, the aspect ratio of a small-diameter through hole 11A in FIG. 3 (the vertical scale and the lateral scale in the drawing are not same) is 10 or greater, for example, and the aspect ratio of a large-diameter through hole 11B is about 5, for example.

(Film Attachment Process)

Figure 4:
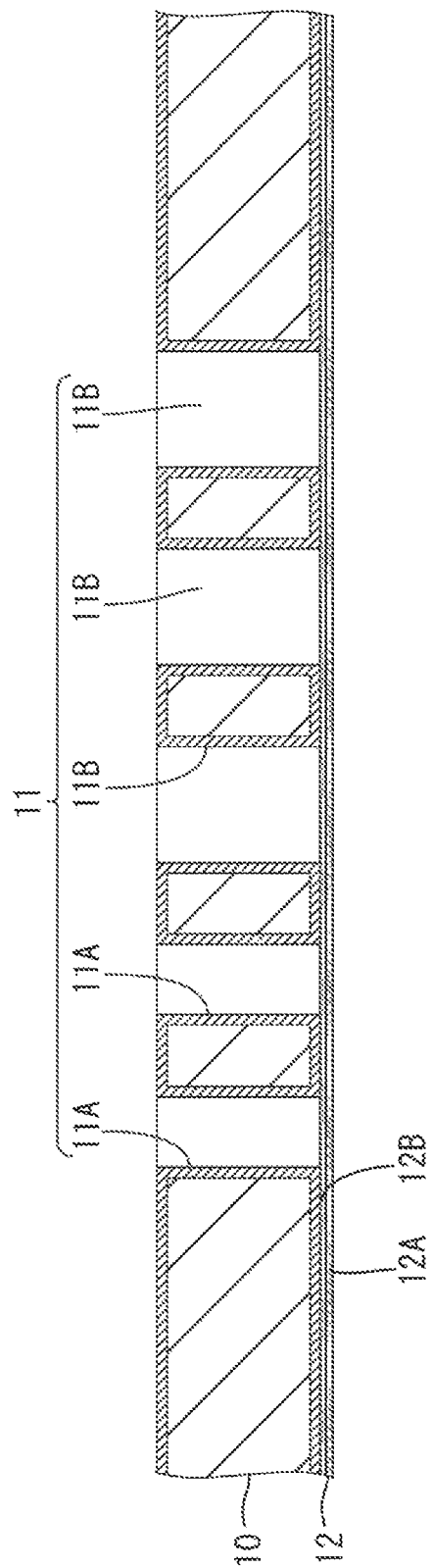
FIG. 4 is a cross-sectional view illustrating a print board after a film attachment process.
Figure 5:
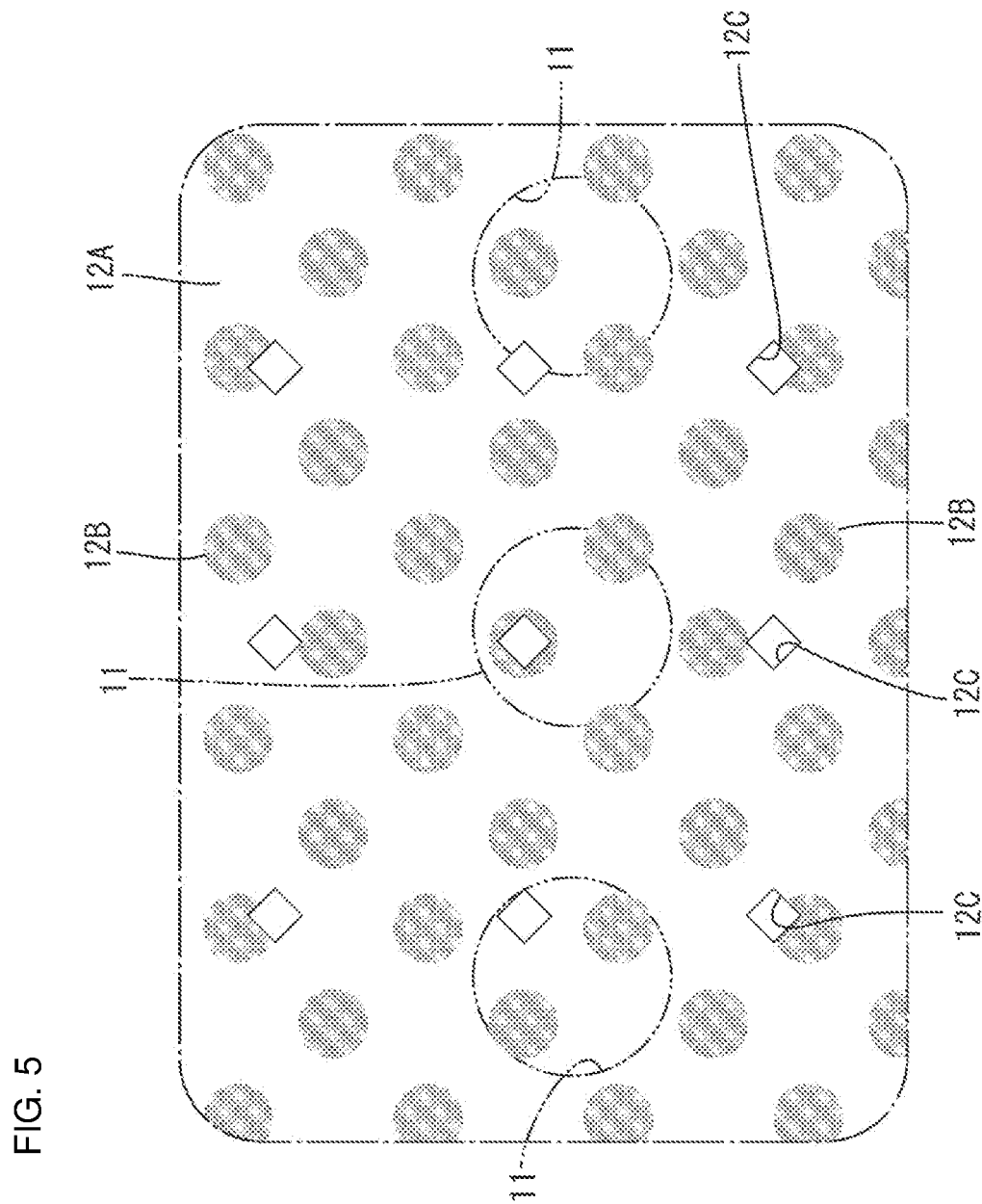
FIG. 5 is an enlarged plan view of a sealing film.

A sealing film 12 is attached to one surface of the print board 10 (a lower surface in FIG. 3 and referred to as aback surface hereinafter) (refer to FIG. 4). The sealing film 12 is made of synthetic resin and has a thickness of from 35 μm to 100 μm. The sealing film 12 includes a base film 12A having a smooth surface and an adhesive layer 12B that is printed on the base film 12A. As illustrated in FIG. 5, round dot portions of the adhesive layer 12B are arranged in a zig-zag form, for example, to be spaced away from each other. Namely, the adhesive layer 12B is divided into portions that are arranged in small areas in the entire area of the base film 12A. The entire area of the base film 12A includes forming areas in which the adhesive layer 12B portions are formed and non-forming areas in which the adhesive layer 12B portions are not formed. The base film 12A and the adhesive layer 12B are transparent and areas inside circles indicating the adhesive layer 12B are illustrated with shading. The diameter of the adhesive layer 12B portion may be smaller or greater than the diameter of the through hole 11 that is illustrated with the two-dot chain line in FIG. 5. The diameter of the adhesive layer 12B portion is within a range from 100 μm to 500 μm and the adhesive layer 12B portions are preferably arranged at intervals each of which is from 10 μm to 400 μm.

As illustrated in FIG. 5, the base film 12A previously includes air permeable micro holes 12C in an entire surface area thereof. The micro hole 12C has a diameter of about from 10 μm to 100 μm. The micro holes 12C are about evenly arranged in a matrix or in a zig-zag form in the entire surface area of the base film 12A at intervals each of which is from 2 mm to 4 mm, for example. The micro holes 12C are formed by pushing the surface of the base film 12A that is opposite from the surface including the adhesive layer 12B with pins having a sharp tip after the adhesive layer 12B is formed on the base film 12A. Micro burrs may be created when the pin is inserted through the base film 12A and the micro burrs may be pushed out to the surface including the adhesive layer 12B.

Just after a hole forming process in which the micro holes 12C are formed (after a few seconds, for example), the sealing film 12 is put on the back surface of the print board 10 such as the surface of the sealing film 12 including the adhesive layer 12B is opposite the back surface of the print board and the sealing film 12 is pressed with a low pressure. Thus, the film attachment process in which the sealing film 12 is attached to the print board 10 is performed. Accordingly, the openings of the through holes 11 on the lower surface side are covered such that the filling material does not come out from the through holes. Namely, the openings of the through holes 11 are substantially sealed at the opening edge surfaces on the lower surface side such that viscous liquid cannot flows through the openings. In the film attachment process, the sealing film 12 is pressed with a low pressure and the micro burrs that are created in the hole forming process slightly protrude toward the print board 10. Therefore, the entire area of each adhesive layer 12B portion may not be closely contacted with the print board 10 and only a micro area of an irregular shape in the adhesive layer 12B is closely contacted with the print board 10. This may create a quite small gap between interfaces of the print board 10 and the sealing film 12 and the small gap is continuous to the air permeable micro holes 12C. Therefore, the openings of the through holes 11 are sealed at the openings on the lower surface side such that viscous liquid cannot flows through the openings but are continuous to the outside such that air can flow through the openings.

(Filling Material Filling Process)

Figure 6:
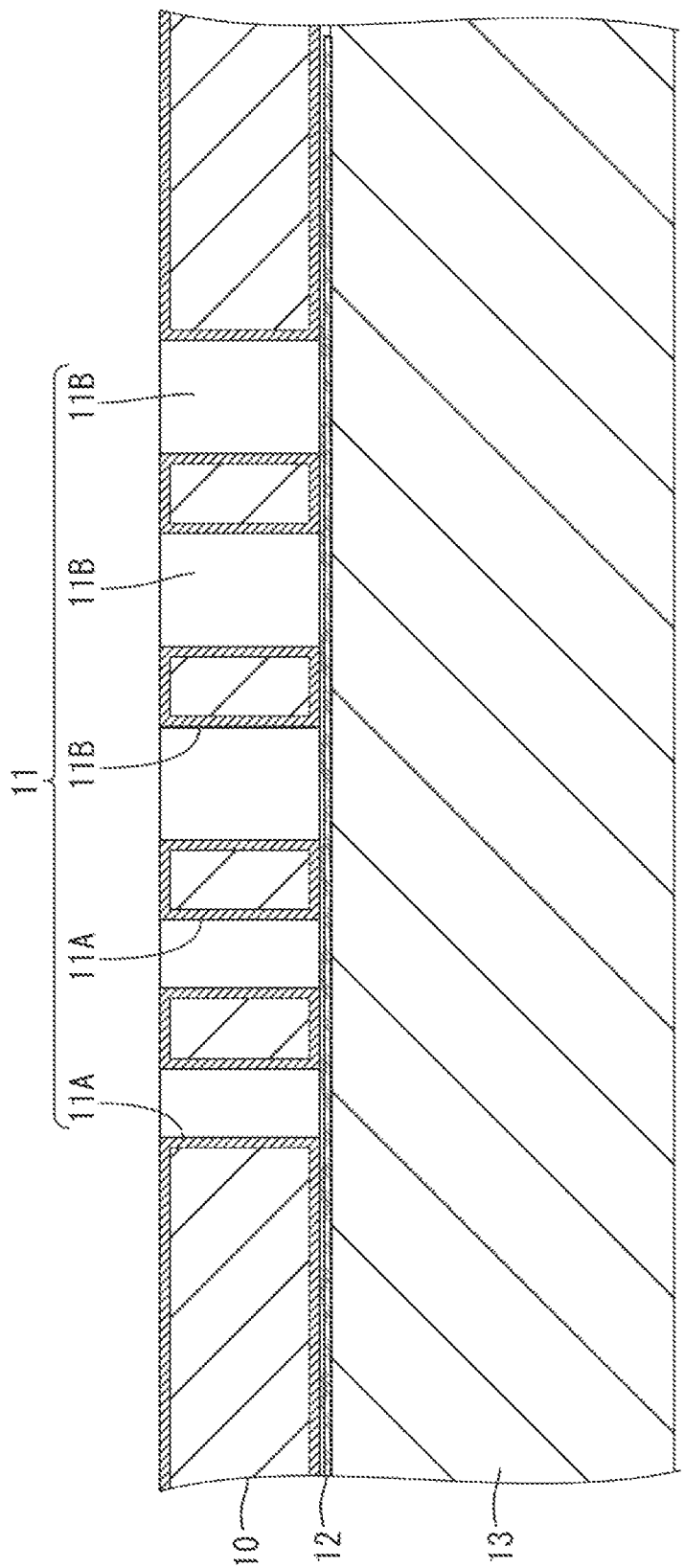
FIG. 6 is a cross-sectional view illustrating the print board disposed on a jig plate.
Figure 7:
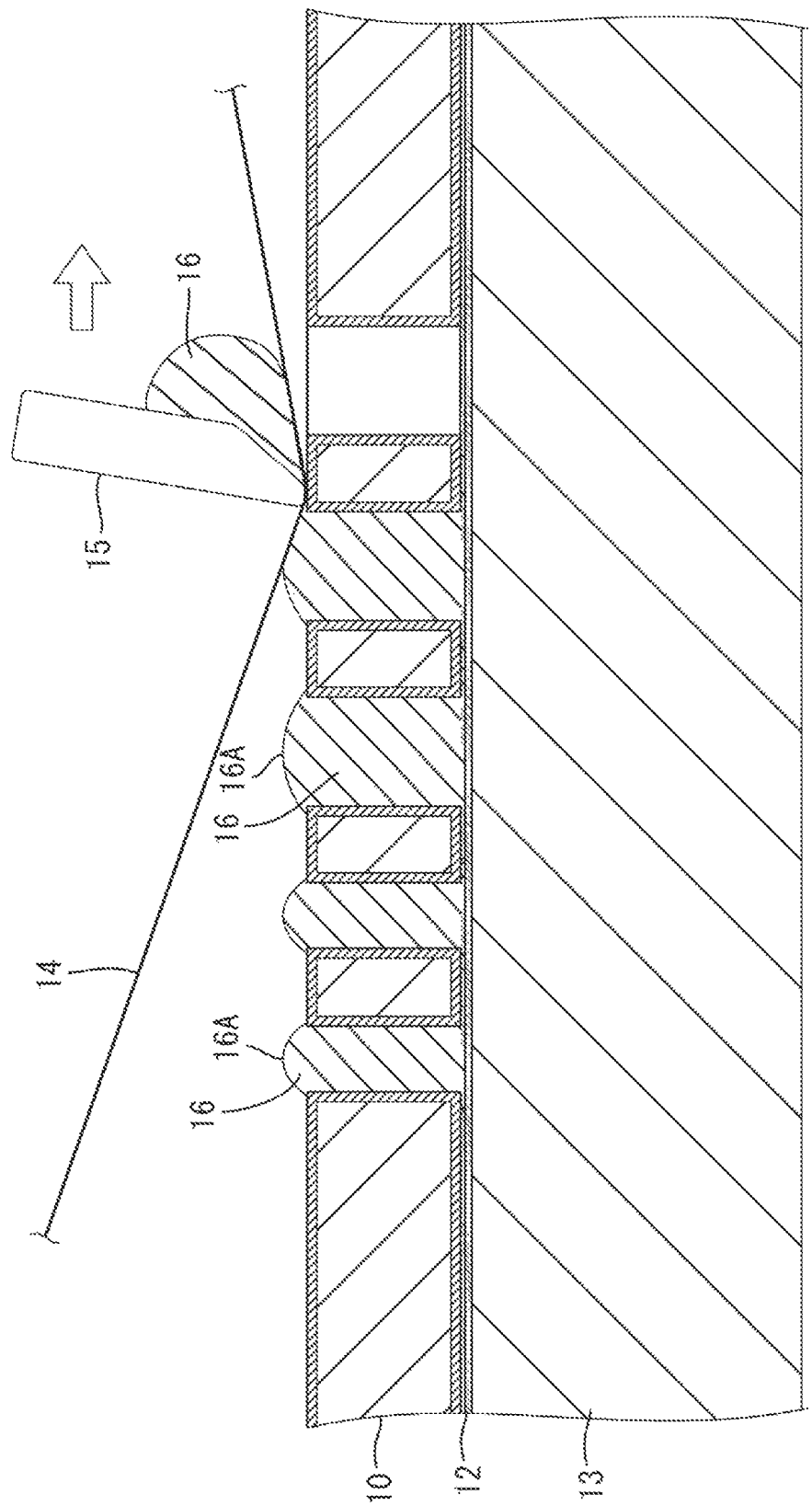
FIG. 7 is a cross-sectional view illustrating the print board in a filling material filling process.
Figure 8:
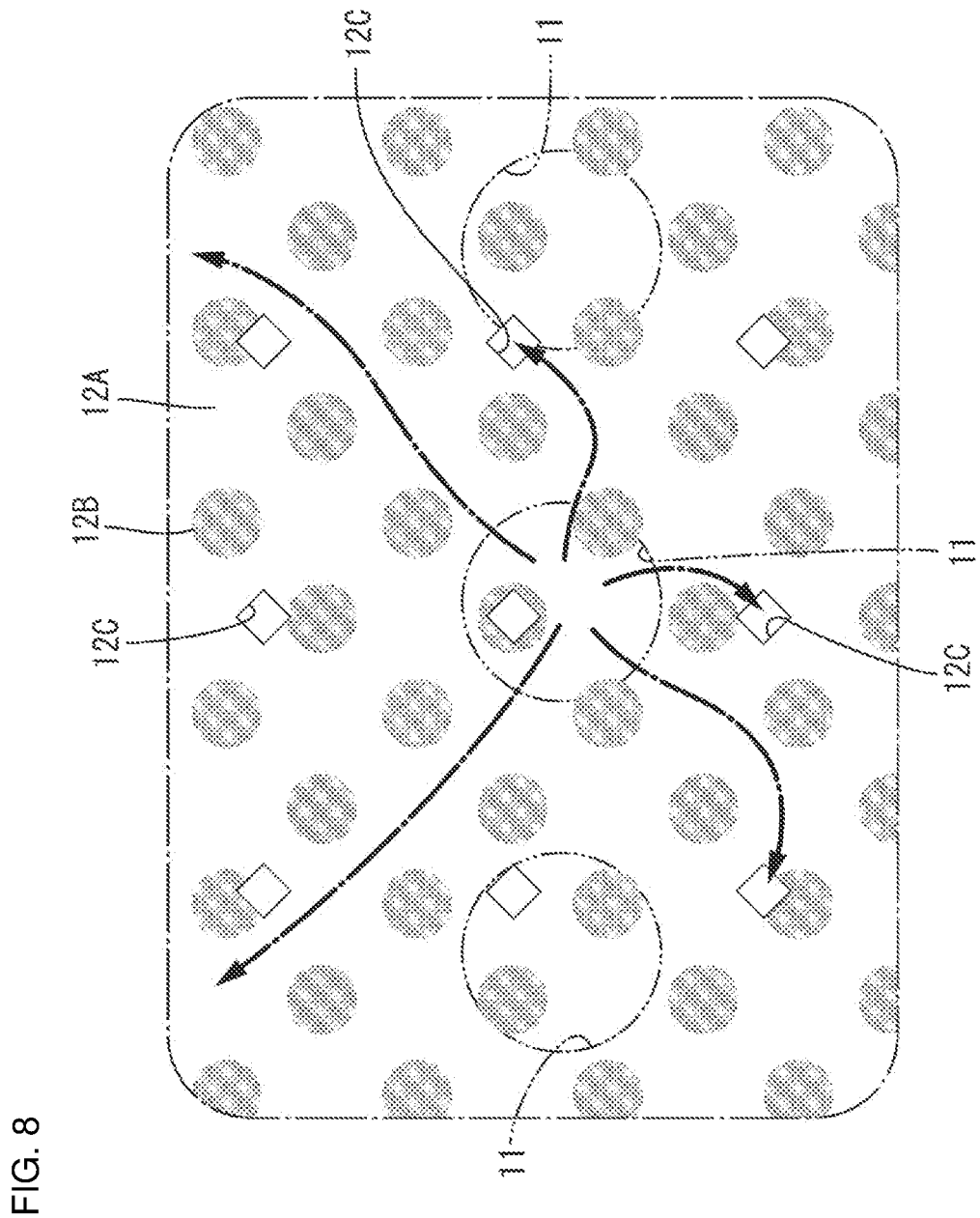
FIG. 8 is a plan view illustrating air flow in the filling material filling process.
Figure 9:
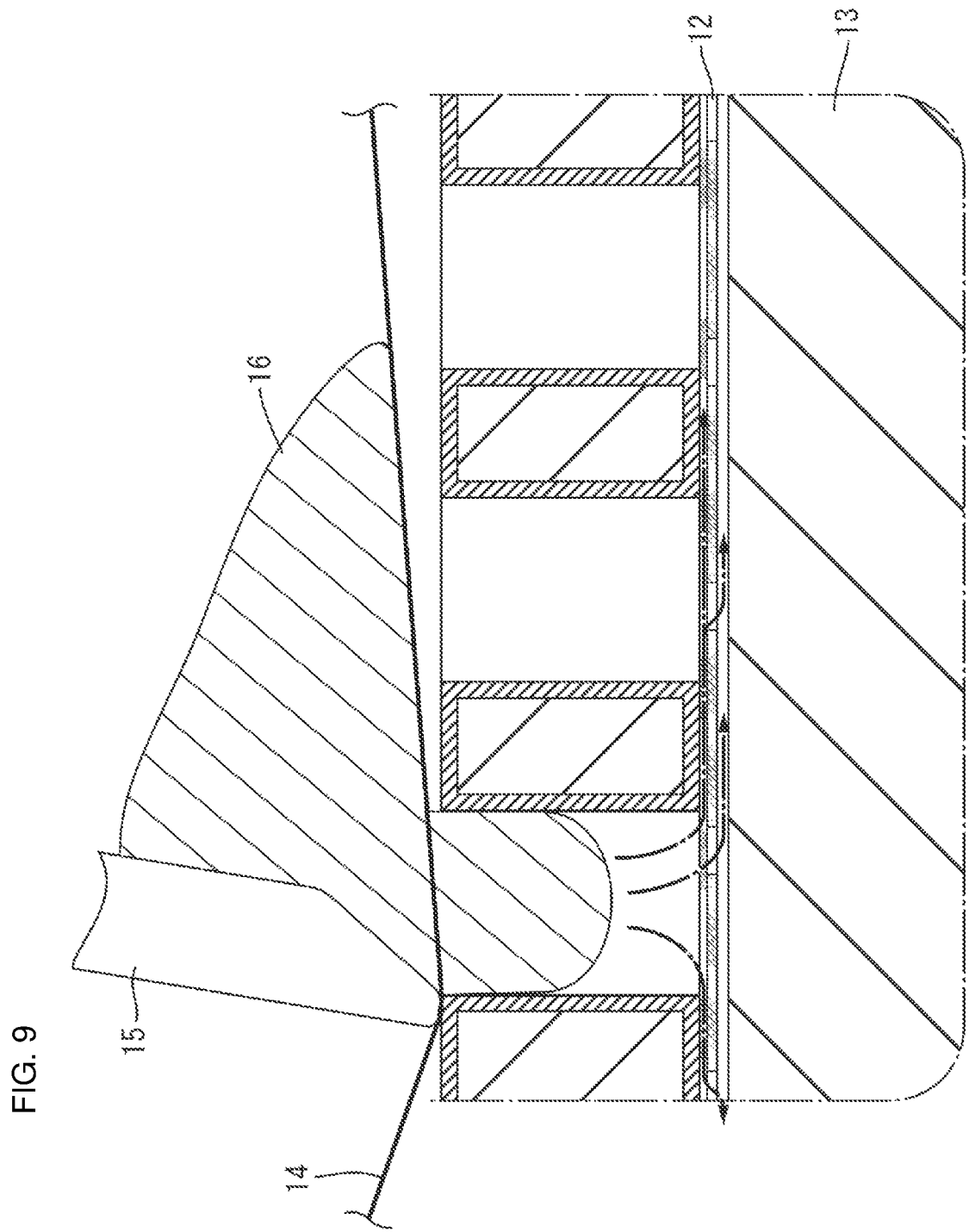
FIG. 9 is a cross-sectional view illustrating air flow in the filling material filling process.

Next, as illustrated in FIGS. 6 and 7, the print board 10 to which the sealing film 12 is attached is disposed on a flat jig 13 and the filling material is supplied with a vacuum printing machine. The vacuum printing machine includes a screen mask 14 and a squeegee 15 in a vacuum room that is kept under a pressure that is effectively lower than an atmospheric pressure (for example, from 50 pa to 100 pa). The squeegee 15 slides along the screen mask 14. The filling material 16 for hole plugging, which is synthetic resin, is supplied on the screen mask 14 and the squeegee 15 is lowered to the screen mask 14 and slides along the screen mask 14. Accordingly, the filling material 16 is pushed downward via the screen mask 14. The vacuum printing machine has such a known configuration. As illustrated in FIG. 7, the print board 10 to which the sealing film 12 is attached is arranged such that the sealing film 12 is contacted with the flat jig 13 and other surface of the print board 10 that is opposite from the sealing film 12 side surface (referred to as a front surface, hereinafter) is under the screen mask 14.

The screen mask 14 includes through holes, which are not illustrated, in portions corresponding to the through holes 11 of the print board 10. The print board 10 is positioned correctly with respect to the screen mask 14 such that the through holes of the screen mask 14 become continuous to the through holes 11 of the print board 10 and the filling material 16 is pushed into the through holes 11.

The entire surface of the flat jig 13, which includes areas corresponding to the through holes 11, is a flat surface. The flat jig 13 supports the sealing film 12 from the lower side and keeps the covered state in which the openings of the through holes 11 on the back surface side are covered with the sealing film 12. Accordingly, the filling material 16 that is pushed into the through holes 11 is less likely to leak through the gap between the sealing film 12 and the print board 10.

The squeegee 15 is a plate member made of synthetic resin as is known. A force of pressing downward the filling material 16 under the screen mask 14 and the pressing amount of the filling material 16 can be controlled by adjusting an angle at which the squeegee 15 is contacted with the screen mask 14 and a pressure at which the screen mask 14 is pressed with the squeegee 15.

The sealing film 12 includes the adhesive layer 12B portions at intervals and the sealing film 12 includes micro holes 12C. When the screen printing is performed on the print board 10 in the vacuum printing machine and the filling material 16 is pushed into the through holes 11, air remaining in the through holes 11 flows through the gap between the adhesive layer 12B portions, the micro holes 12C, and the small gap between the sealing film 12 and the flat jig 13 to the vacuum room as illustrated in broken lines in FIGS. 8 and 9. Therefore, the through holes 11 are filled with the filling material 16 smoothly until the filling material 16 in the through holes 11 reaches the sealing film 12.

On the other hand, the filling material 16 includes a protruding portion 16A on the screen mask 14 side surface that is opposite side from the sealing film 12 side surface. The protruding portion 16A is formed after the squeegee 15 passes by the through hole 11, as illustrated in FIG. 7. The protruding portion 16A slightly protrudes upward with respect to the opening edge surface of the through hole 11. The protruding portion 16A is formed from the filling material 16 that comes out from the through holes of the screen mask 14 when the screen mask 14 is separated from the front surface of the print board 10. Therefore, the protrusion dimensions from the opening edge surface of the through holes 11 are almost same regardless of the various diameters of the through holes 11.

(Film Separation Process)

Figure 10:
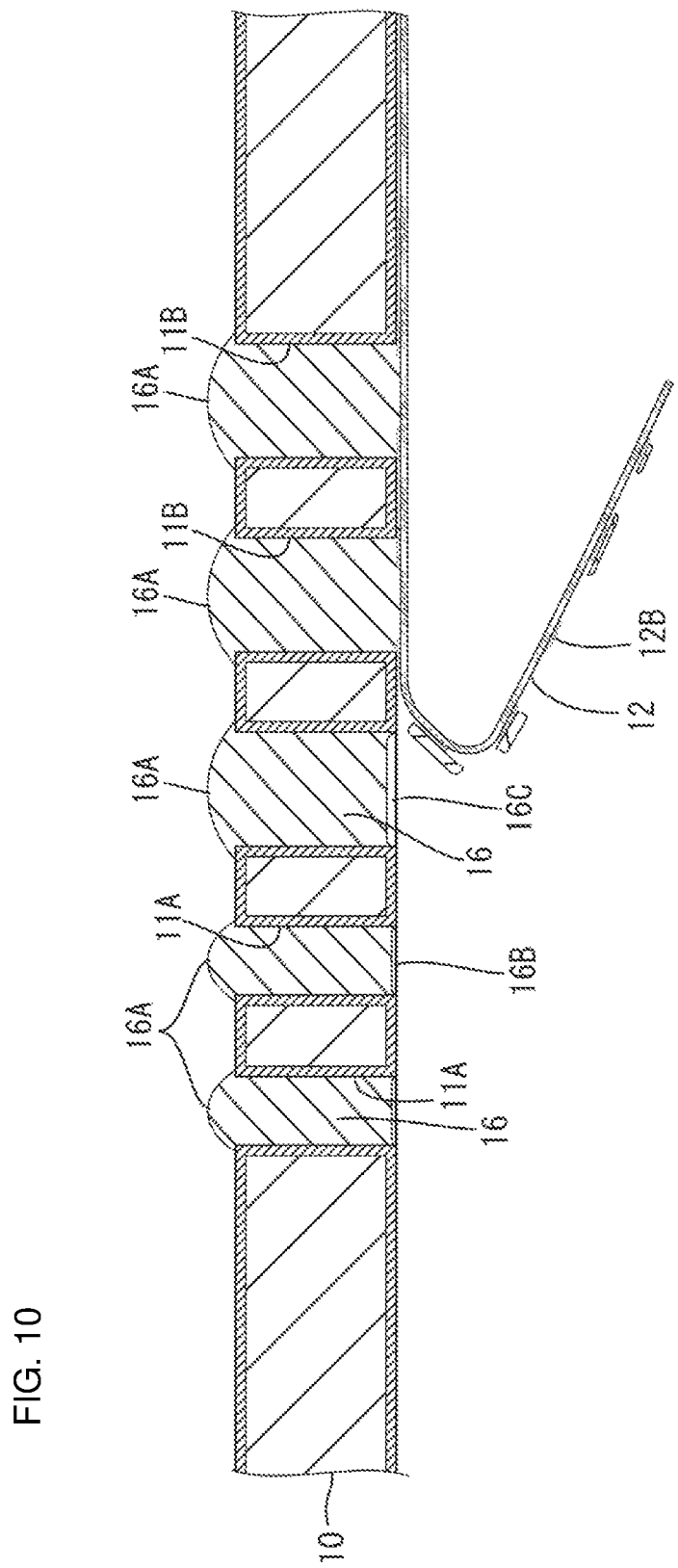
FIG. 10 is a cross-sectional view illustrating the print board in a film separation process.
Figure 11:
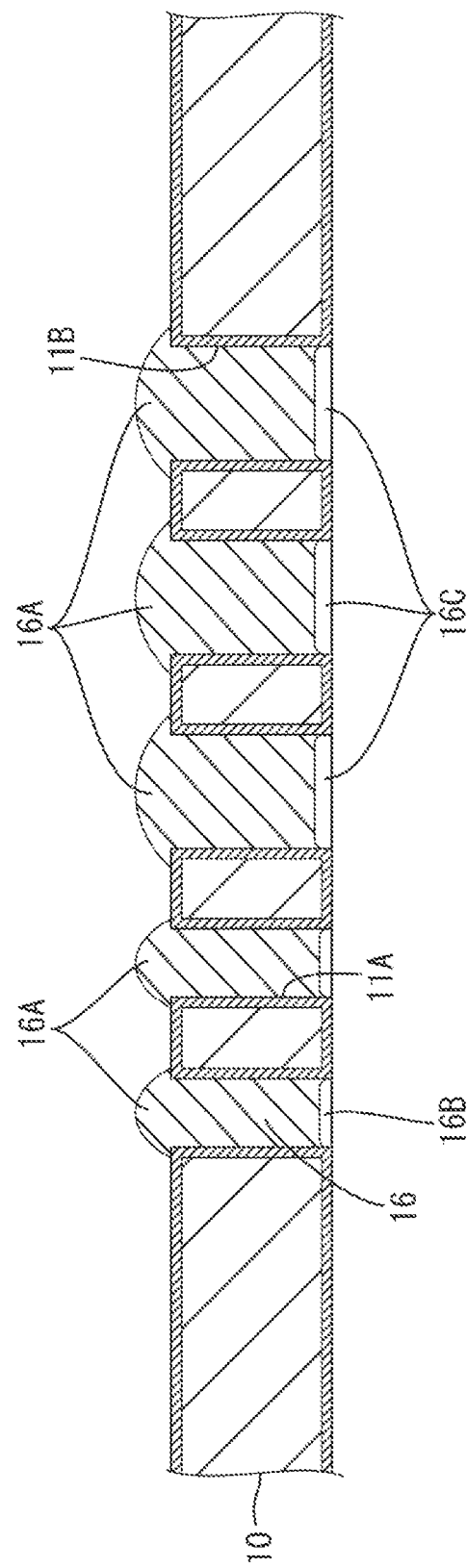
FIG. 11 is a cross-sectional view illustrating the print board after the film separation process.

Next, the print board 10 is taken out from the vacuum printing machine and the sealing film 12 is separated from the print board 10 as illustrated in FIG. 10. In this embodiment, the filling material 16 is material that is completely cured by heating or irradiation of ultraviolet rays. Before starting the curing of the filling material 16 after the filling material filling process, the sealing film 12 is separated from the print board 10. Therefore, a portion of the filling material 16 within the through hole 11 may adhere to the adhesive layer 12B and may be removed from the through hole 11. As a result, a recess 16B of about 10 μm may be created in the filling material 16 in the small-diameter through hole 11A and a recess 16C of about 30 μm may be created in the filling material 16 in the large-diameter through hole 11B (refer to FIG. 11).

(Auxiliary Filling Process)

Figure 12:
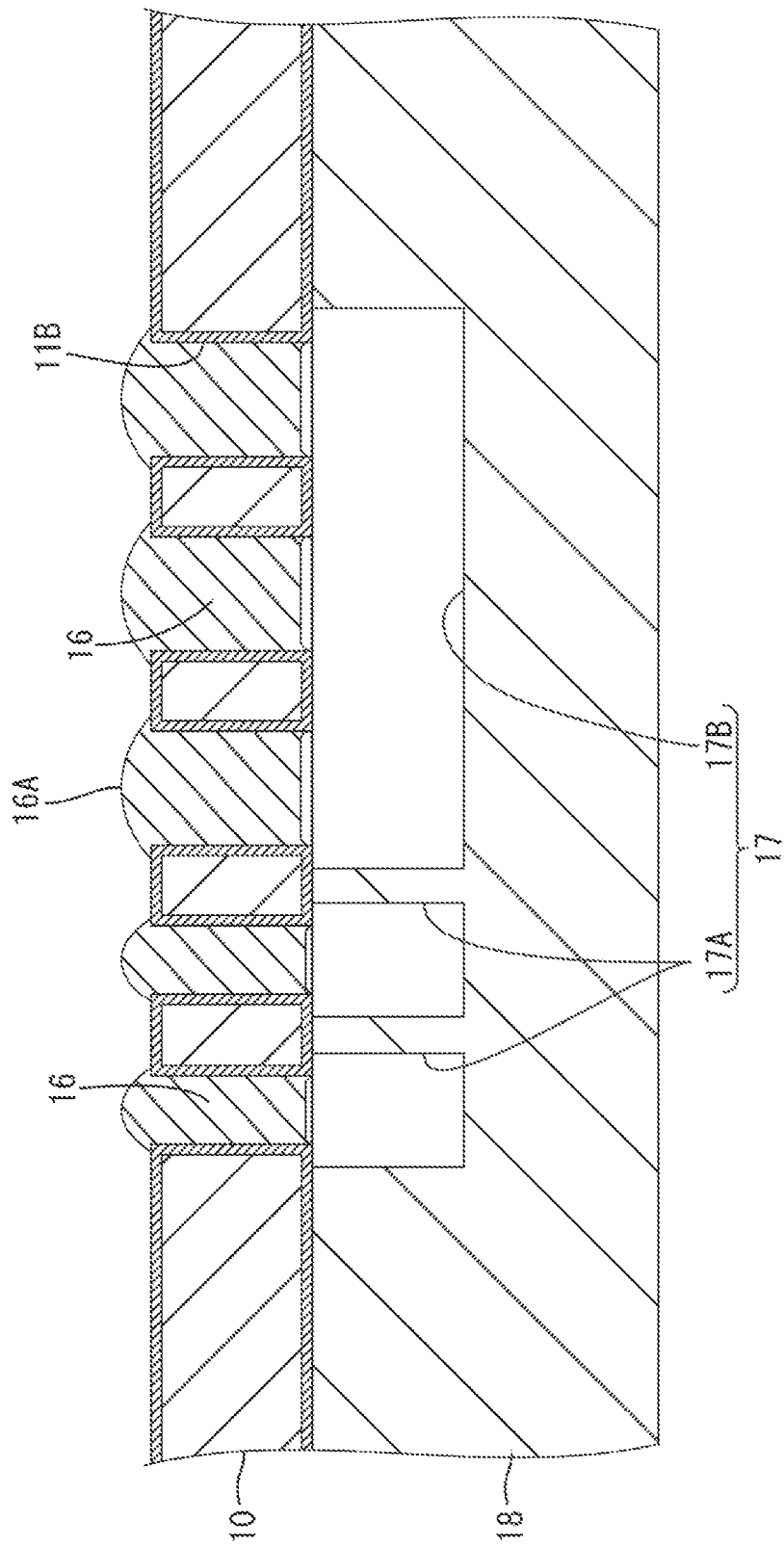
FIG. 12 is a cross-sectional view illustrating the print board disposed on a counterbore jig plate.

Next, the print board 10 from which the sealing film 12 is separated is set in the vacuum printing machine again. In this process, a support jig 18 that includes recesses 17 corresponding to the through holes 11 of the print board 10 is previously set in the vacuum printing machine instead of the flat jig 13. The print board 10 is arranged on the support jig 18 such that the through holes 11 correspond to the recesses 17 appropriately. As illustrated in FIG. 12, the recesses 17 may include an independent recess 17A and a collective recess 17B. The recess 17A has an inner diameter that is slightly greater than the hole diameter of the through hole 11 and is formed to correspond to one through hole 11A. The recess 17B has a size corresponding to an area including the through holes 11B. The support jig 18 has a flat upper surface including the recesses 17A, 17B and supports the print board 10 while the flat upper surface being closely contacted with the back surface of the print board 10.

Figure 13:
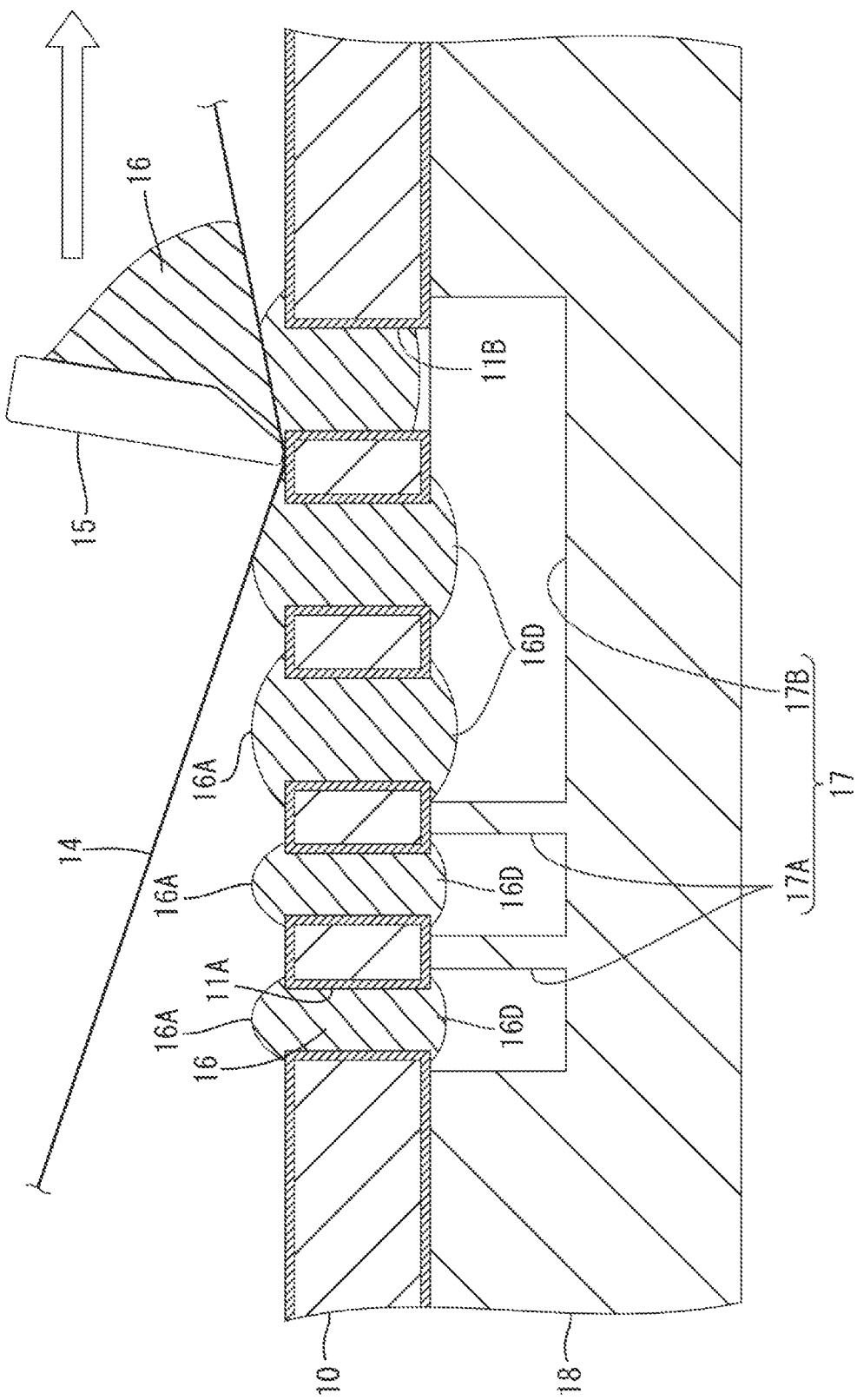
FIG. 13 is a cross-sectional view illustrating the print board in an auxiliary filling process.
Figure 14:
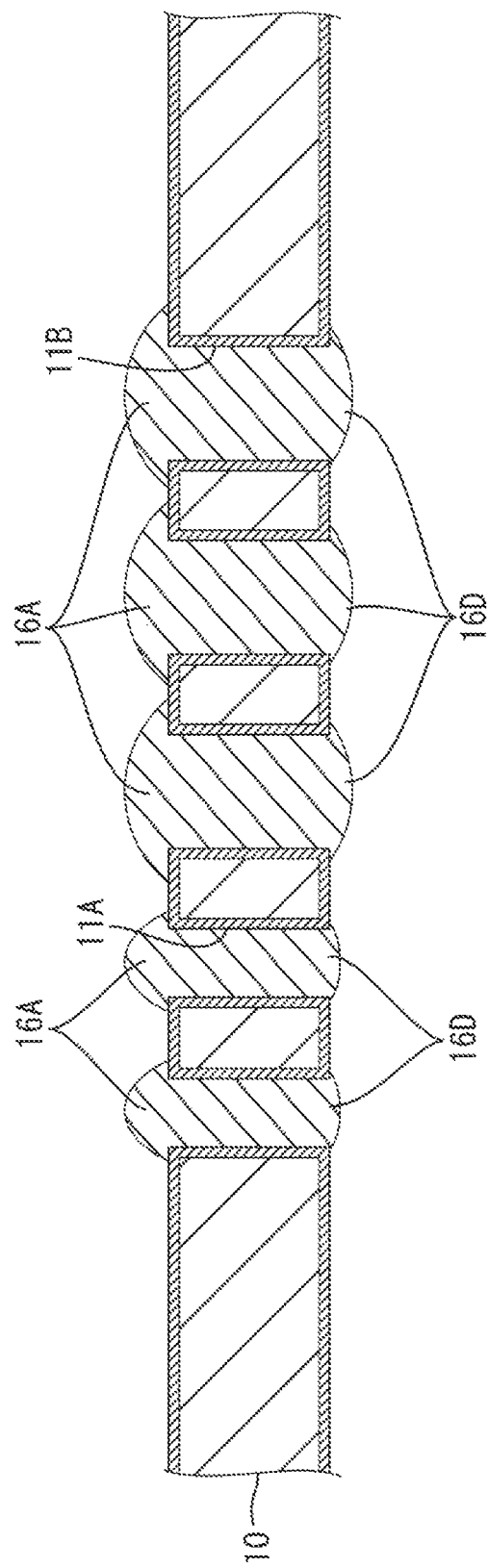
FIG. 14 is a cross-sectional view illustrating the print board after the auxiliary filling process.

The print board 10 is positioned on the support jig 18 in the vacuum printing machine and the vacuum printing machine is set to the vacuum room again as necessary and the screen printing is performed on the print board 10 from the front surface side with the filling material 16. In this state, the through holes 11 are filled with the filling material 16 almost entirely except for the recesses 16B and 16C and the openings of the through holes 11 on the back surface side are continuous to the recesses 17A and 17B of the support jig 18. Therefore, the filling resistance of the filling material 16 created in the screen printing is quite small. Therefore, even if the pressing amount with which the squeegee 15 is contacted with and presses the screen mask 14 is reduced to perform the filling material filling process with a small filing force, the through holes 11 can be supplied into the through holes 11. Accordingly, as illustrated in FIG. 13, the filling material 16 is protruded from the opening edge surfaces on the back surface side and protruding portions 16D are created.

The screen printing is performed with a quite small filling force. Therefore, volumes of the protruding portions 16D protruding from the opening edge surfaces of the through holes have smaller variation than those in the prior art regardless of the size of the hole diameter of the through holes 11. Namely, the volume of the protruding portion 16D in the small-diameter through hole 11A and that in the large-diameter through hole 11B have little variation.

(Filling Material Curing Process)

Next, the print board 10 that has been subjected to the auxiliary filling process is taken out from the vacuum printing machine and the filling material 16 is completely cured by heating or irradiation of ultraviolet rays.

(Flattening Process)

Figure 15:
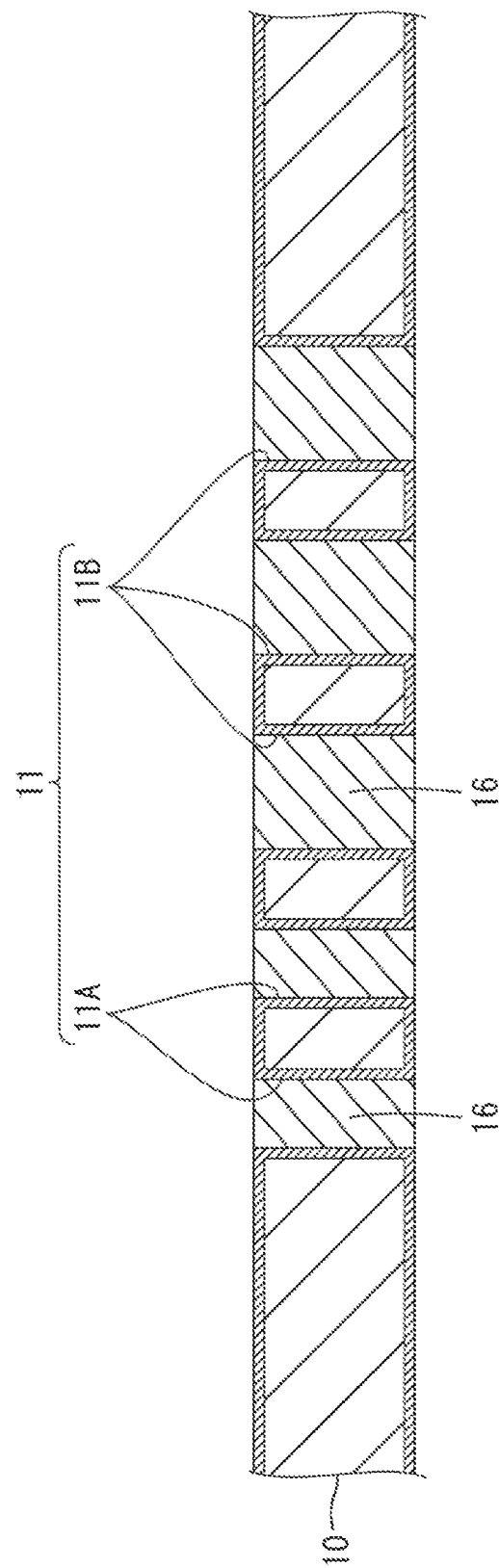
FIG. 15 is a cross-sectional view illustrating the print board after a flattening process.

After the filling material 16 is completely cured, the two surfaces of the print board 10 are polished with buffing and the protruding portions 16A, 16D, which protrude from the hole edge surfaces of the through holes 11 on the two surfaces of the print board 10, are removed. Then, as illustrated in FIG. 15, entire areas of the two surfaces of the print board 10 are flattened.

A buff polishing device, which is not illustrated, includes rollers and buffs. The print board 10 that is disposed on the roller is transferred in a certain direction. The rotation axes of the buffs extend along the surface of the print board 10 and in a direction perpendicular to the transferring direction. The buffs are arranged on upper and lower sides with respect to the print board 10 and two buffs are arranged on each of the upper and lower sides at intervals in the transferring direction of the print board 10. In this embodiment, the print board 10 is first polished by a first buff on the back surface side and polished by a first buff on the front surface side next. Then, the print board 10 is polished by a second buff on the front surface side and finally polished by a second buff on the back surface side. When polishing is performed by each buff, polishing material is supplied and the print board 10 is supported by back up rollers that are disposed on the opposite side from the buff.

The volumes of the protruding portions 16D of the filling material 16 have small variation on the back surface side of the print board 10 regardless of the various diameters of the through holes 11. Therefore, in polishing with the first buff, the protruding portions 16D can be polished uniformly over the entire area of the back surface of the print board 10.

The volumes of the protruding portions 16A of the filling material 16 have small variation regardless of the various diameters of the through holes 11. Therefore, when polishing of the front surface of the print board 10 is started, the protruding portions 16A can be polished evenly over the entire area of the front surface of the print board 10. Thus, the polishing is proceeded uniformly on the back surface and the front surface. Therefore, an unpolished portion of the protruding portion is less likely to be created on one surface due to the variation in the volumes of the protruding portions 16. The print board 10 is less likely to be strongly pressed toward the buff due to the unpolished portions on the one surface when the polishing is started on another surface. Therefore, the polishing is performed uniformly on the two surfaces. The copper foils are less likely to be removed excessively in portions of the front and back surfaces of the print board 10 and an excessive amount of the filling material is less likely to remain.

According to this embodiment, when the through holes 11 of the print board 10 are filled with the filling material 16, variation in the volumes of the protruding portions of the filling material 16 on the upper and lower surfaces of the print board 10 can be made small regardless of the various diameters of the through holes 11. Therefore, the protruding portions 16A, 16D of the filling material 16 can be polished uniformly over the entire area of the surfaces in the subsequent flattening process.

Particularly, in this embodiment, the filling of the filling material 16 is performed with screen printing in the filling material filling process. Therefore, only the target through hole 11 can be selectively filled with the filling material 16. For example, all the through holes that are to be filled with the filling material may be divided into two groups according to the aspect ratios. The two groups include a group of through holes having high aspect ratios and a group of through holes having low aspect ratios. The through holes having high aspect ratios may be filled with filling material in first screen printing and the through holes having low aspect ratios may be filled with filling material in second screen printing. Such a filling material filling process including divided steps may be included as the filling material filling process. Printing conditions appropriate for the target group of through holes in each screen printing can be set and this embodiment is particularly preferable for filling the through holes having high aspect ratios.

In this embodiment, the sealing film 12 includes dot portions of the adhesive layer 12B that are spaced from each other in an area of the base film 12A. The remaining air within the through holes 11 easily flows through the spaces between the dot portions (an adhesive layer non-forming area) and the filling of the filling material can be smoothly performed.

Other Embodiments

The present invention is not limited to the embodiments, which have been described using the foregoing descriptions and the drawings. For example, embodiments described below are also included in the technical scope of the present invention.

(1) In the above embodiment, the print board for the IC package including the IC chip is used as the print board. However, the method is not limited to the method of producing the above-described print board but may preferably be used for plugging through holes of a high aspect ratio in a print board such as a core board of a build-up board.

(2) In the above embodiment, the screen printing is performed in the filling material filling process and the auxiliary filling process. However, in such processes, the screen mask may not be used and the filling material may be supplied to an entire surface of the print board and the filling material may be pushed into the through holes with a squeegee or with using pressure difference created between the two surfaces of the print board. When the screen printing is performed in the filling material filling process and the auxiliary filling process, the processes may not be necessarily performed in the same vacuum printing machine unlike in the above embodiment but may be performed in different vacuum printing machines. In such a method, the flat jig and the support jig can be previously set in the respective vacuum printing machines and one jig is not necessary to be switched to another one in a single vacuum printing machine. This improves productivity.

(3) In the filling material filling process of the above embodiment, the sealing film is attached to one surface of the print board to close the openings of the through holes at one opening edge on the one surface side. However, the film is not necessarily required. If the print board has good flatness, the print board may be disposed on a flat jig plate to perform filling of filling material. In the above embodiment, the adhesive layer is closely contacted with the print board when the openings of the through holes are covered with the film. The adhesive layer is divided into small areas in the surface area of the base film and the surface area of the base film includes the small areas and the non-forming areas that include no adhesive layer. Therefore, air is allowed to flow through the non-forming areas that includes no adhesive layer and eventually air is allowed to flow from the through holes to the outside. This leads to smooth filling of the filling material.

(4) In the above embodiment, since the base film of the sealing film includes the air permeable micro holes, the micro holes accelerate air to discharge from the through holes in printing the filling material under the vacuum atmosphere to perform filling of filling material smoothly. However, the base film does not necessarily include the micro holes but an air permeable porous film (made of ultrahigh molecular weight polyethylene, for example) including pores may be used as the base film. The base film may not necessarily include air flow passages therethrough. Abase film may include grooves on a surface thereof to which the print board is to be attached with an adhesive. The grooves have a micro depth and are arranged in a matrix or an irregular form. When a sealing film including such a base film is attached to the print board, air flow passages that are continuous to the outside are created between interfaces thereof. Therefore, the air flow passages accelerate air to discharge from the through holes in printing the filling material under the vacuum atmosphere to perform filling of filling material smoothly.

(5) In the above embodiment, the auxiliary filling process is performed before curing the filling material; however, the auxiliary filling process may be performed after the curing is started unavoidably or intentionally. The auxiliary filling process may be performed such that a portion of the filling material that has been inside the through hole protrudes from the openings of the through holes by supplementarily supplying the filling material into the through holes.

(6) In the above embodiment, the copper plating layer having electric conductive properties is disposed on the inner surfaces of the through holes. However, a resin layer including functional material selectively having necessary properties in electric conductive properties, magnetic properties, or inductive properties may be disposed on the inner surfaces of the through holes. Functional material selectively having necessary properties in electric conductive properties, magnetic properties, or inductive characteristics may be used as the filling material.

(7) In the above embodiment, the method is applied to the print board including the through holes of various hole diameters. However, the method may be applied to a print board that is disposed directly below the semiconductor chip and includes micro through holes that are collectively arranged in a matrix or a zig-zag matrix and (for example, the through holes are arranged at intervals each of which is 0.5 mm or less and an area including the micro through holes is a quadrangular area having one side of 20 mm or greater). In the filling material filling process in which the filling material is supplied into the through holes while the lower openings of the through holes being covered, the through holes are entirely filled with the filling material. In the subsequent auxiliary filling process, the filling material is gently supplied to the through holes and the filling material can be protruded downward evenly in the through holes while suppressing warping of the print board.

Even in the configuration including through holes including a relatively large diameter such as 0.5 mm or greater, the downward protruding amount of the filling material can be easily adjusted and uniform protrusion can be obtained because the through holes are entirely filled with the filling material in the filling material filling process first and the filling material is additionally supplied gently in the subsequent auxiliary filling process.

(8) In the above embodiment, the filling of the filling material is performed with screen printing; however, the filling method is not limited to the above one. Other method without using the screen mask such as a filling method only using a squeegee or a filling method without using a squeegee and supplying filling material from one surface of the print board with pressure may be used. Any filling material filling methods or any method of combination of the methods may be used to perform the filling material filling process and the auxiliary filling process of the present invention and supply the filling material into the through holes in two steps.

(9) In the above embodiment, the adhesive layer 12B includes the round dot portions that are spaced away from each other. However, the shape of the dot portions is not limited to a perfect circular shape but may be a non-circular shape such as a quadrangular shape, a polygonal shape, and an elongated circular shape. Furthermore, an adhesive layer may be defined into belt-shaped areas. The adhesive layer is not necessarily disposed on an entire area that is to be attached to the print board but may be preferably disposed such that the portion to be attached to the print board includes the adhesive layer forming area and the adhesive layer non-forming area.

EXPLANATION OF SYMBOLS

10: print board
11: through hole
12: sealing film (film)
12A: base film
12B: adhesive layer
12C: micro hole
13: flat jig
18: support jig
14: screen mask
15: squeegee
16: filling material
16A, 16D: protruding portion

The invention claimed is:

1. A method of producing a print board including through holes that are filled with filling material, the method comprising:
 a filling material filling process, in which opening edge surfaces of the through holes on one surface side of the print board are covered such that the filling material does not come out from the through holes, the filling material filling process including pushing the filling material into the through holes from another surface side of the print board to fill the through holes with the filling material; and
 an auxiliary filling process that is performed after the filling material filling process and before the filling material is cured, the auxiliary filling process, in which openings of the through holes on the one surface side are uncovered, including supplying the filling material into the through holes again from the another surface side of the print board.

2. The method according to claim 1, wherein in the auxiliary filling process, the print board is positioned on a support jig that includes recesses in a portion corresponding to the through holes such that one surface of the print board contacts the support jig and the filling material is supplied from the another surface side of the print board.

3. The method according to claim 1, wherein in the auxiliary filling process, the filling material is supplied from the another surface side of the print board such that portions of the filling material protrude from the opening edge surfaces of the through holes on the one surface side.

4. The method according to claim 1, further comprising:
 a film attachment process including attaching a film including a base film and an adhesive layer disposed on a surface of the base film to one surface of the print board to cover the openings of the through holes on the one surface side such that the filling material does not come out from the through holes; and
 after the film attachment process, arranging the print board on a flat jig having a flat surface in at least a portion corresponding to the through holes and performing the filling material filling process,
 wherein, in the auxiliary filling process, a film separation process including separating the film is performed prior to the supplying of the filling material into the through holes.

5. The method according to claim 1, wherein in the auxiliary filling material filling process, a screen mask is disposed on the another surface of the print board and a squeegee is moved along the screen mask while supplying the filling material onto the screen mask, whereby the through holes are filled with the filling material through micro holes formed in the screen mask.

6. The method according to claim 5, wherein the filling material filling process is performed several times corresponding to several times of screen printing operations with different print conditions.

7. The method according to claim 4, further comprising:
a hole forming process including pushing a pin having a sharp tip into a surface of the base film that is an opposite surface from the adhesive layer after the adhesive layer is formed on the base film, whereby air permeable micro holes are formed in the base film, wherein
after the hole forming process, the film attachment process is performed.

8. A sealing film that is to be attached to a print board when supplying filling material into through holes of the print board with a printing method under a vacuum atmosphere, the sealing film being to be attached to the print board from an opposite side from a filling material supplying side, the sealing film comprising:
a base film;
an adhesive layer disposed on the base film; and
an air flowing passage that connects interfaces of the print board and the base film to an outside, wherein
the adhesive layer includes divided portions within an area to be attached to the print board and a non-forming area in which no adhesive layer is disposed is included in the area.

9. The sealing film according to claim 8, wherein the air flowing passage includes air flowing grooves that are recessed in a surface of the base film.

10. The sealing film according to claim 8, wherein the air flowing passage includes air permeable micro holes that are through the base film.

* * * * *